United States Patent
Krasner et al.

(10) Patent No.: US 11,609,695 B2
(45) Date of Patent: Mar. 21, 2023

(54) STATISTICAL AND NEURAL NETWORK APPROACH FOR DATA CHARACTERIZATION TO REDUCE STORAGE SPACE REQUIREMENTS

(71) Applicant: EMC IP HOLDING COMPANY LLC, Hopkinton, MA (US)

(72) Inventors: John Krasner, Coventry, RI (US); Sweetesh Singh, Benares (IN)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 126 days.

(21) Appl. No.: 17/009,822

(22) Filed: Sep. 2, 2020

(65) Prior Publication Data

US 2022/0066647 A1 Mar. 3, 2022

(51) Int. Cl.
   G06F 3/06 (2006.01)
   H03M 7/30 (2006.01)
   G06N 3/08 (2023.01)
   G06F 17/18 (2006.01)
   G06F 18/22 (2023.01)

(52) U.S. Cl.
   CPC ........... *G06F 3/0608* (2013.01); *G06F 3/064* (2013.01); *G06F 3/067* (2013.01); *G06F 17/18* (2013.01); *G06F 18/22* (2023.01); *G06N 3/08* (2013.01); *H03M 7/6088* (2013.01)

(58) Field of Classification Search
   CPC combination set(s) only.
   See application file for complete search history.

(56) References Cited

U.S. PATENT DOCUMENTS

| | | | |
|---|---|---|---|
| 8,555,018 B1 * | 10/2013 | Rohr | G06F 3/0685 |
| | | | 707/758 |
| 8,996,480 B2 * | 3/2015 | Agarwala | G06F 3/067 |
| | | | 707/693 |
| 10,120,893 B1 * | 11/2018 | Rocamora | G06N 20/00 |
| 10,366,053 B1 * | 7/2019 | Zheng | G06F 16/137 |
| 2016/0364176 A1 * | 12/2016 | Sun | G06F 3/0619 |
| 2018/0277068 A1 * | 9/2018 | Diederich | G06N 3/02 |
| 2019/0034334 A1 * | 1/2019 | Arelakis | H03M 7/40 |
| 2019/0235758 A1 * | 8/2019 | Constantinescu | G06F 3/0643 |
| 2020/0272605 A1 * | 8/2020 | More | G06N 3/0454 |
| 2021/0256427 A1 * | 8/2021 | Schott | G06N 20/10 |
| 2022/0245096 A1 * | 8/2022 | Ferranti | H03M 7/3059 |

* cited by examiner

*Primary Examiner* — Nanci N Wong
(74) *Attorney, Agent, or Firm* — Anderson Gorecki LLP

(57) ABSTRACT

A data model is trained to determine whether data is raw, compressed, and/or encrypted. The data model may also be trained to recognize which compression algorithm was used to compress data and predict compression ratios for the data using different compression algorithms. A storage system uses the data model to independently identify raw data. The raw data is grouped based on similarity of statistical features and group members are compressed with the same compression algorithm and may be encrypted after compression with the same encryption algorithm. The data model may also be used to identify sub-optimally compressed data, which may be uncompressed and grouped for compression using a different compression algorithm.

18 Claims, 5 Drawing Sheets

STATISTICAL AND NEURAL NETWORK APPROACH FOR DATA CHARACTERIZATION TO REDUCE STORAGE SPACE REQUIREMENTS

TECHNICAL FIELD

The subject matter of this disclosure is generally related to data storage systems and more particularly to data compression.

BACKGROUND

Storage Area Networks (SANs) and Network-Attached Storage (NAS) are examples of data storage systems that are used to maintain large data sets. Such storage systems often support multiple host servers and multiple host applications. Data replication, backup, protection, and a variety of other storage-related functions help to avoid data loss and maintain data availability but tend to increase storage space requirements. Compression can help to reduce storage space requirements, but compressibility of data is a function of multiple variables and the data storage system may not be provided with an indication of whether data was provided by a host server in a form that is suitable for compression.

SUMMARY

An apparatus in accordance with some of the inventive aspects comprises: at least one compute node that manages access to non-volatile storage, the compute node configured to respond to commands from host nodes to access host application data stored on the non-volatile storage; a data model that has been trained to recognize compression state; and a recommendation engine that uses the data model to identify the compression state of the host application data stored on the non-volatile storage and prompts compression of at least some of the host application data that is identified by the data model as being in an uncompressed state.

A method in accordance with some of the inventive aspects comprises: in a storage system comprising at least one compute node that manages access to non-volatile storage, the compute node configured to respond to commands from host nodes to access host application data stored on the non-volatile storage: using a data model that has been trained to recognize compression state to identify the compression state of the host application data stored on the non-volatile storage; and prompting compression of at least some of the host application data that is identified by the data model as being in an uncompressed state.

A data storage system configured to independently identify compression state of stored data and compress that data in accordance with some inventive aspects comprises: at least one compute node that manages access to non-volatile storage, the compute node configured to respond to commands from host nodes to access host application data stored on the non-volatile storage; a data model that has been trained to recognize compression state and encryption state; and a recommendation engine that: uses the data model to identify the compression state and the encryption state of data structures or blocks of the host application data stored on the non-volatile storage; groups ones of the data structures or blocks of the host application data that are both uncompressed and unencrypted into at least one group based on similarity of statistical features; and compresses all data structures or blocks of the group with a single compression algorithm.

Other aspects, features, and implementations may become apparent in view of the detailed description and figures. All examples, aspects and features mentioned in this document can be combined in any technically possible way.

DETAILED DESCRIPTION

Some aspects, features, and implementations described herein may include machines such as computers, electronic components, optical components, and processes such as computer-implemented procedures and steps. It will be apparent to those of ordinary skill in the art that the computer-implemented procedures and steps may be stored as computer-executable instructions on a non-transitory computer-readable medium. Furthermore, it will be understood by those of ordinary skill in the art that the computer-executable instructions may be executed on a variety of tangible processor devices, i.e. physical hardware. For practical reasons, not every step, device, and component that may be part of a computer or data storage system is described herein. Those of ordinary skill in the art will recognize such steps, devices, and components in view of the teachings of the present disclosure and the knowledge generally available to those of ordinary skill in the art. The corresponding machines and processes are therefore enabled and within the scope of the disclosure.

The terminology used in this disclosure is intended to be interpreted broadly within the limits of subject matter eligibility. The terms "logical" and "virtual" are used to refer to features that are abstractions of other features, e.g. and without limitation abstractions of tangible features. The term "physical" is used to refer to tangible features that possibly include, but are not limited to, electronic hardware. For example, multiple virtual computers could operate simultaneously on one physical computer. The term "logic" is used to refer to special purpose physical circuit elements, firmware, software, computer instructions that are stored on a non-transitory computer-readable medium and implemented by multi-purpose tangible processors, and any combinations thereof.

Figure 1:
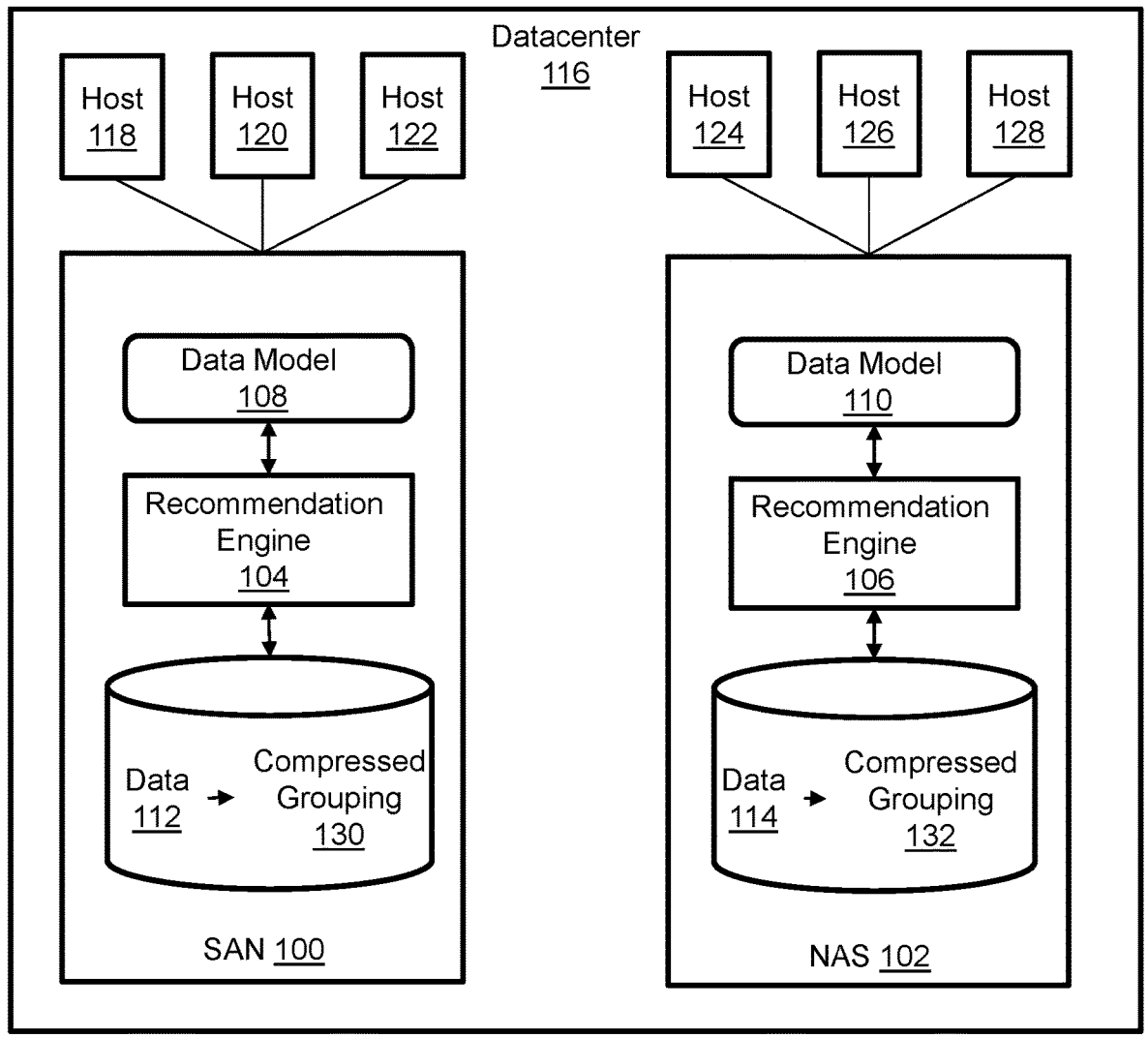
FIG. 1 illustrates SAN and NAS nodes with recommendation engines that use data models to reduce storage space requirements for stored data.

FIG. 1 illustrates a simplified datacenter 116 including a storage area network (SAN) 100 and network-attached storage (NAS) 102 with recommendation engines 104, 106 that use data models 108, 110 to reduce storage space requirements for stored host application data 112, 114. The data models 108, 110 are generated using a machine learning process such as linear regression/classification, random forest, and deep neural networks, for example, and without limitation. The stored data 112, 114 is host application data that is used by clustered hosts 118, 120, 122, 124, 126, 128. The hosts may be implemented as servers that run multiple instances of host applications on virtual machines or in containers. The recommendation engines 104, 106 use the respective data models 108, 110 to characterize the stored data 112, 114 based on statistical features. Data is grouped based on similarity of statistical features. Data within each group is compressed. For example, a portion of the stored data 112, 114 that is characterized as being in both an unencrypted and uncompressed state and is compressible with at least a predetermined compression ratio may be grouped and compressed, resulting in compressed groupings 130, 132. Furthermore, each recommendation engine may select a compression algorithm that is calculated to be likely to achieve the best compression ratio for the grouped data. In some implementations the recommendation engine determines that the stored data is already compressed, e.g. provided to the SAN or NAS by the hosts in compressed form, identifies the compression algorithm that was used to compress the data, determines that the compression algorithm that was used is unlikely to achieve the best compression ratio based on the results of the characterization, and prompts use of a different compression algorithm that is likely to achieve the best compression ratio. Advantageously, these data reduction functions are performed automatically without an indication from a host or other external source of whether the data is in an encrypted or compressed state and without being provided with the identity of the compression algorithms that were used to compress data that was sent to the SAN or NAS in a compressed state. Each data model enables the associated recommendation engine to distinguish between unencrypted and encrypted data and uncompressed and compressed data using only the data model and the stored data. Further, compressibility of the data, suitability of particular compression algorithms to the data, and identification of which compression algorithm was used to compress data that was provided to the SAN or NAS in compressed form can be determined using only the data model and the data.

Figure 2:
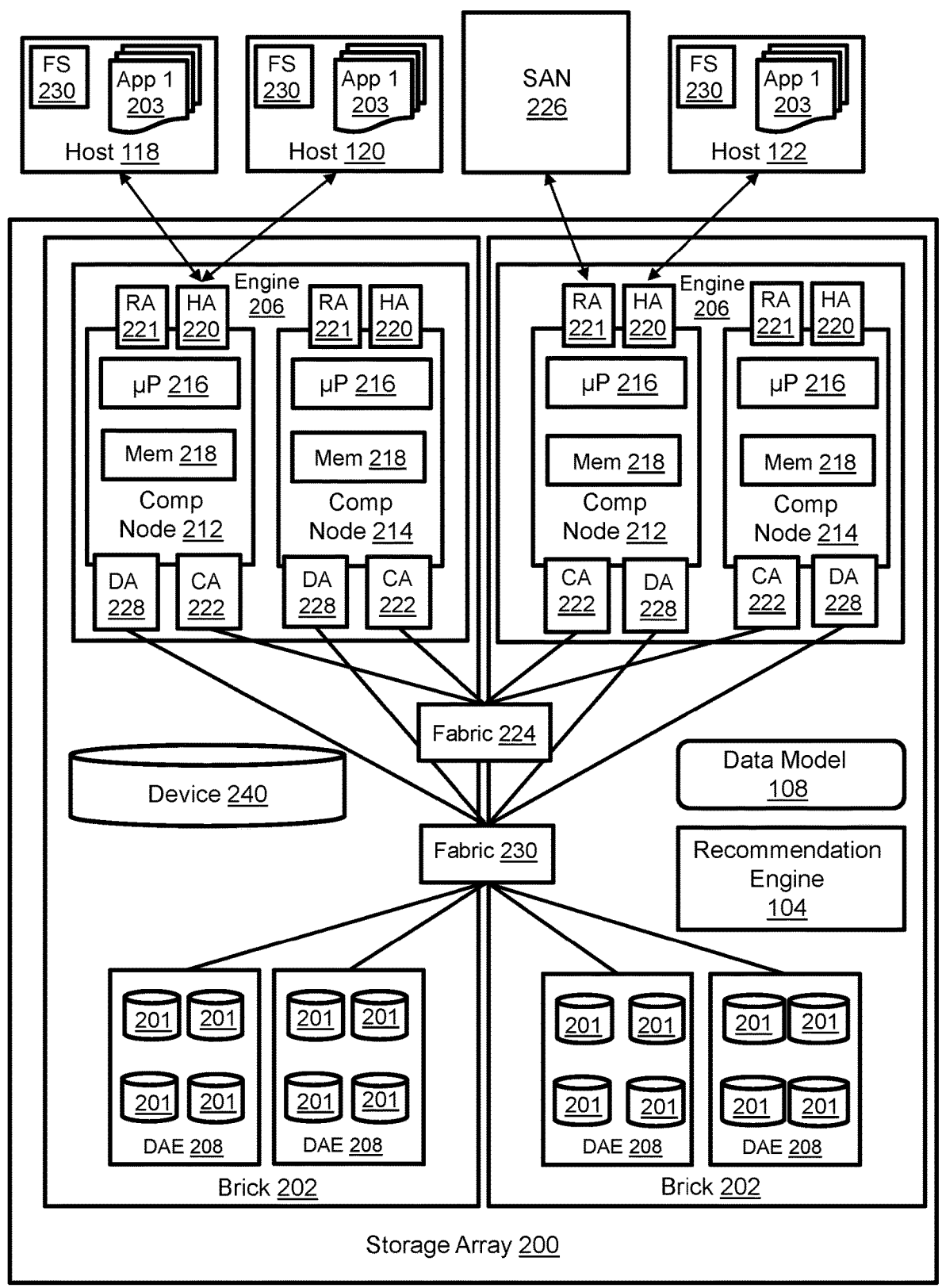
FIG. 2 illustrates an implementation of the SAN of FIG. 1.

FIG. 2 illustrates a storage array 200 that is one possible implementation of the SAN of FIG. 1. The storage array 200 includes one or more bricks 202. Each brick 202 includes an engine 206 and one or more drive array enclosures (DAEs) 208. Each engine 206 includes a pair of interconnected compute nodes 212, 214 that are arranged in a failover relationship and may be referred to as "storage directors." Although it is known in the art to refer to the compute nodes of a SAN as "hosts" that naming convention is avoided in this disclosure to help avoid confusion with the hosts 118, 120, 122 that run host application instances 203 from the compute nodes 212, 214. Nevertheless, the host applications could run on the compute nodes. Each compute node includes resources such as at least one multi-core processor 216 and local memory 218. The processor 216 may include central processing units (CPUs), graphics processing units (GPUs), or both. The local memory 218 may include volatile media such as dynamic random-access memory (DRAM), non-volatile memory (NVM) such as storage class memory (SCM), or both. Each compute node includes one or more host adapters (HAs) 220 for communicating with the hosts. Each host adapter has resources for receiving and responding to input-output commands (IOs) from the hosts. The host adapter resources may include processors, volatile memory, and ports via which the hosts may access the storage array. Each compute node also includes a remote adapter (RA) 221 for communicating with other storage systems such as a SAN 226 on which a production volume replica is maintained. Each compute node also includes one or more drive adapters (DAs) 228 for communicating with managed drives 201 in the DAEs 208. Each drive adapter has processors, volatile memory, and ports via which the compute node may access the DAEs for servicing IOs. Each compute node may also include one or more channel adapters (CAs) 222 for communicating with other compute nodes via an interconnecting fabric 224. The managed drives 201 include non-volatile storage media such as, without limitation, solid-state drives (SSDs) based on EEPROM technology such as NAND and NOR flash memory and hard disk drives (HDDs) with spinning disk magnetic storage media. Drive controllers may be associated with the managed drives as is known in the art. An interconnecting fabric 230 enables implementation of an N-way active-active backend. A backend connection group includes all drive adapters that can access the same drive or drives. In some implementations every drive adapter 228 in the storage array can reach every DAE via the fabric 230. Further, in some implementations every drive adapter in the storage array can access every managed drive 201.

Data associated with host application instances 203 running on the hosts is maintained on the managed drives 201. The managed drives 201 are not discoverable by the hosts but the storage array creates a logical storage device 240 that can be discovered and accessed by the hosts. Without limitation, the logical storage device 240 may be referred to as a storage object, source device, production volume, production device, or production LUN, where the logical unit number (LUN) is a number used to identify logical storage volumes in accordance with the small computer system interface (SCSI) protocol. From the perspective of the hosts, the logical storage device 240 is a single drive having a set of contiguous fixed-size logical block addresses (LBAs) on which data used by the host application instances 203 resides. However, the host application data is stored at non-contiguous addresses on various managed drives 201. The compute nodes 212, 214 maintain metadata that maps between the logical storage device 240 and the managed drives 201 in order to process IOs from the hosts. The hosts maintain filesystems 230 that identify and describe high-level data structures such as files, lists, arrays, stacks, queues, and trees within the host application data. TO commands from the hosts to the storage array reference LBAs of the logical storage device 240. The storage array does not have access to the filesystems and is therefore unaware of the high-level data structures in the data. Consequently, the recommendation engine 104 and data model 108 characterize and process the data without reference to or use of the high-level data structures described by the filesystems 230. Recommendations generated by the recommendation engine are provided to the compute nodes and may be forwarded to the hosts. The recommendations may be interpreted as hints or commands depending on the implementation.

Figure 3:
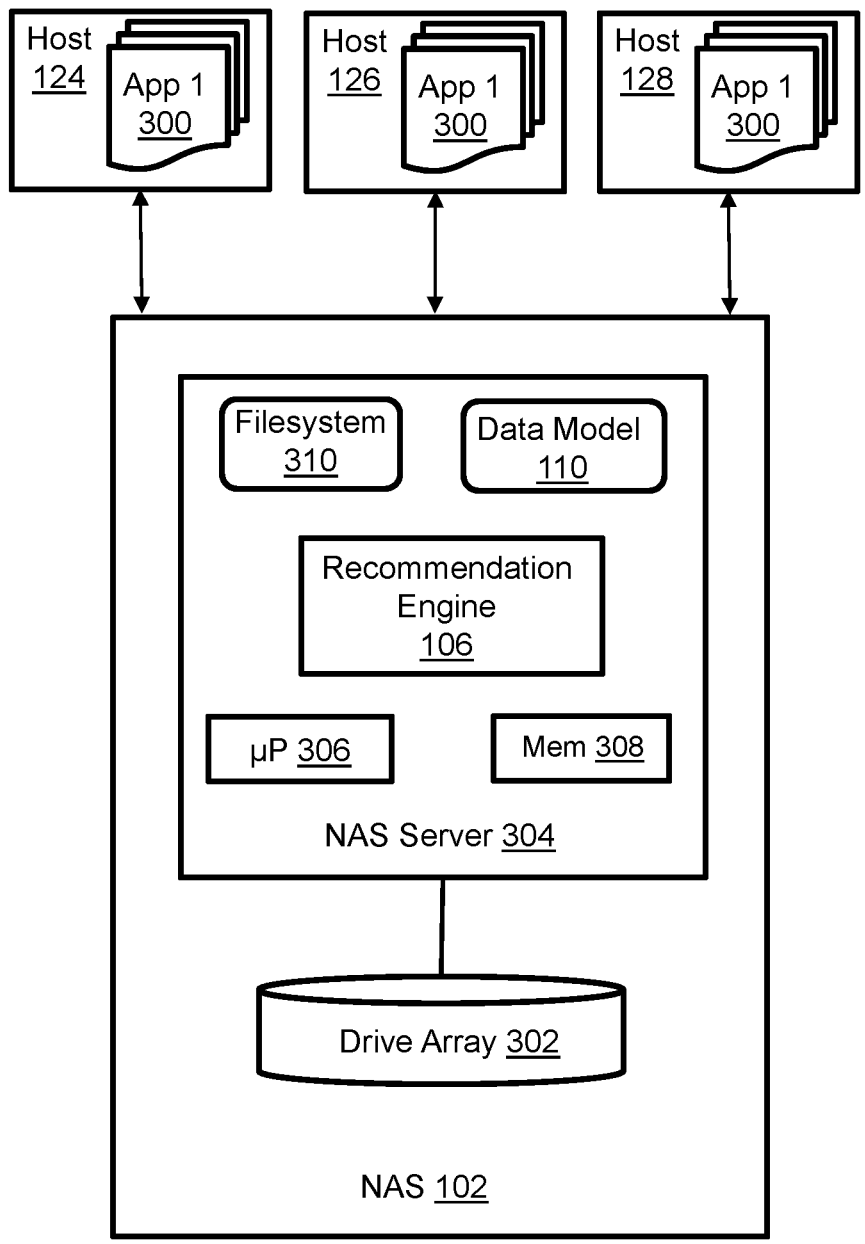
FIG. 3 illustrates an implementation of the NAS of FIG. 1.

FIG. 3 illustrates an implementation of the NAS 102 of FIG. 1. Data associated with host application instances 300 running on the hosts 124, 126, 128 is maintained on a drive array 302. The hosts access the data by sending IOs to a NAS server 304 that manages access to the drive array. The NAS server includes at least one multi-core processor 306 and local memory 308. The processor may include CPUs, GPUs, or both. The local memory may include volatile media such as DRAM, NVM such as SCM, or both. The NAS server maintains a filesystem 310 that identifies and describes high-level data structures such as files, lists, arrays, stacks, queues, and trees within the host application data stored on the drive array. Consequently, the recommendation engine 106 and data model 110 characterize and process stored data with reference to and use of high-level data structures. The recommendations, which may be implemented by the NAS server or hosts, may be interpreted as hints or commands depending on the implementation.

Figure 4:
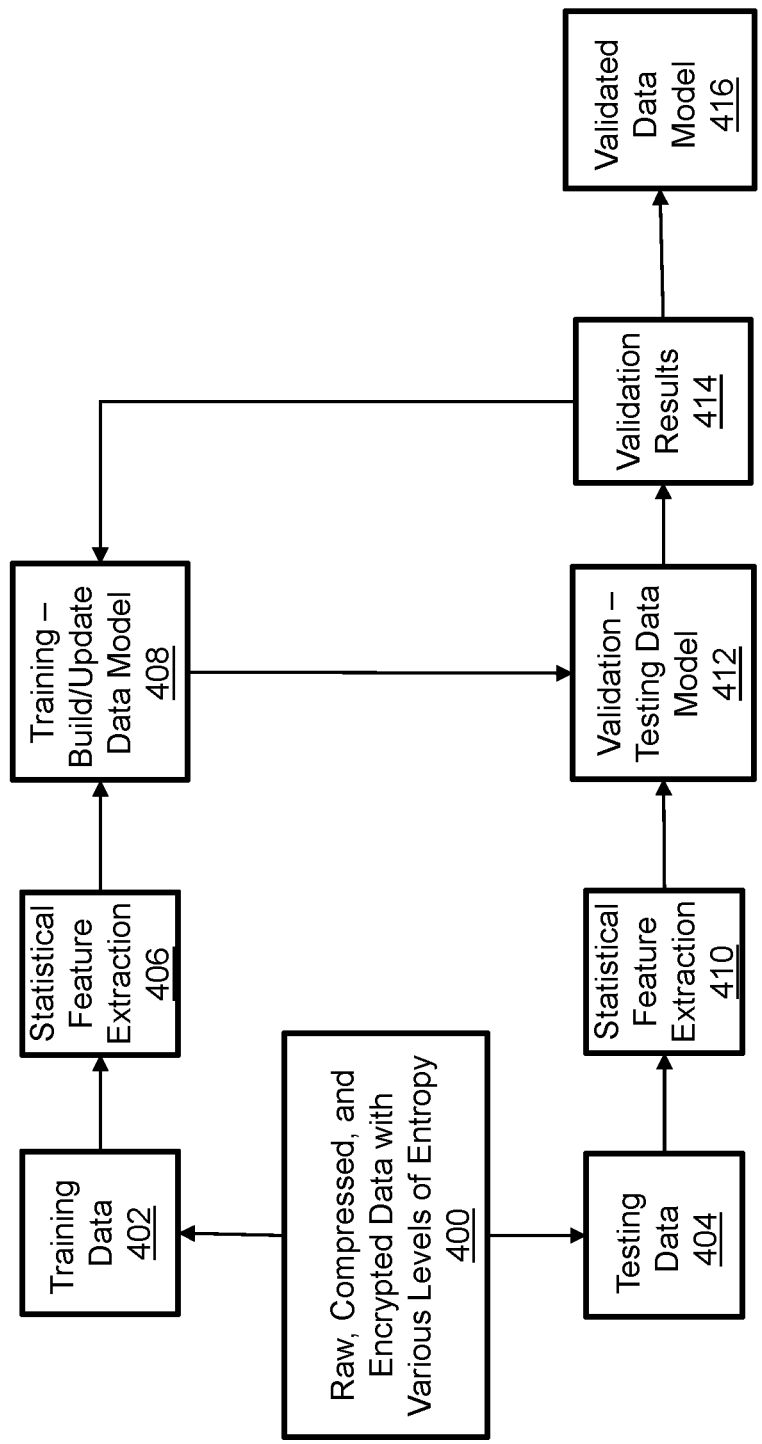
FIG. 4 illustrates generation of a data model.

FIG. 4 illustrates generation of a data model such as the SAN data model 108 (FIG. 2) or the NAS data model 110 (FIG. 3). A dataset 400 that includes raw (uncompressed and unencrypted) data, compressed data, and encrypted data with various levels of entropy is divided into training data 402 and testing data 404. The compressed data in the dataset 400 includes chunks of data that have been compressed using different compression algorithms. The identities of the compression algorithms may be known and associated with the respective compressed chunks. The encrypted data includes chunks of data that have been encrypted using one or more encryption algorithms. The identities of the encryption algorithms may be known and associated with the respective chunks. Some or all of the encrypted data may have been compressed before encryption. The compressed and encrypted data may be compressed and encrypted forms of the raw data. The dataset 400 may be selected or created with a range of entropy calculated to encompass the range of entropy of host application data that will be processed by the data model. Statistical features are extracted from the training data in step 406. For generation of a data model for a SAN the features may include one or more of entropy, Chi square test results, Pearson's correlation coefficients, mean, median, mode, standard deviation, skewness and kurtosis. Entropy is a measure of disorder that may be calculated using well documented techniques. Chi square and Pearson's correlation indicate the presence or absence of a relationship between variables and may also be calculated using well documented techniques. Skewness is a measure of lack of symmetry that may also be calculated using well documented techniques. Kurtosis is a measure of whether data is heavy-tailed or light-tailed relative to a normal distribution that may also be calculated using well documented techniques. Mean, median, mode, and standard deviation are well-understood in the art and may also be calculated using well documented techniques. For generation of a data model for a NAS the features may include one or more of data structure type and size, entropy, Chi square test and Pearson's correlation coefficient, mean, median, mode, standard deviation, skewness and kurtosis. For example, data structure type such as "file" and data structure size such as file size may be used as features. The extracted features are used in a training step 408 to build a data model. The same statistical features are extracted from the testing data 404 in step 410. For generation of a data model for a SAN the features may include one or more of entropy, Chi square test, Pearson's correlation coefficient, mean, median, mode, standard deviation, skewness, and kurtosis. For generation of a data model for a NAS the features may include one or more of data structure type and size, entropy, Chi square test, Pearson's correlation coefficient, mean, median, mode, standard deviation, skewness, and kurtosis. The extracted features are used in a validation step 412 to test the data model. If the validation results 414 indicate that the data model is not yet properly trained, then the data model is updated and further trained in step 408. If the validation results indicate that the data model is properly trained, then the data model is outputted as a validated data model 416. A properly trained data model is able to distinguish between raw and compressed and/or encrypted data with at least a predetermined level of accuracy. Further, a properly trained data model is able to identify which compression algorithm was used to compress data that is in a compressed state with a predetermined level of accuracy, provided the data model was trained with that compression algorithm. Still further, a properly trained data model is able to project compression ratios for data with a predetermined level of accuracy using compression algorithms with which the data model was trained.

Figure 5:
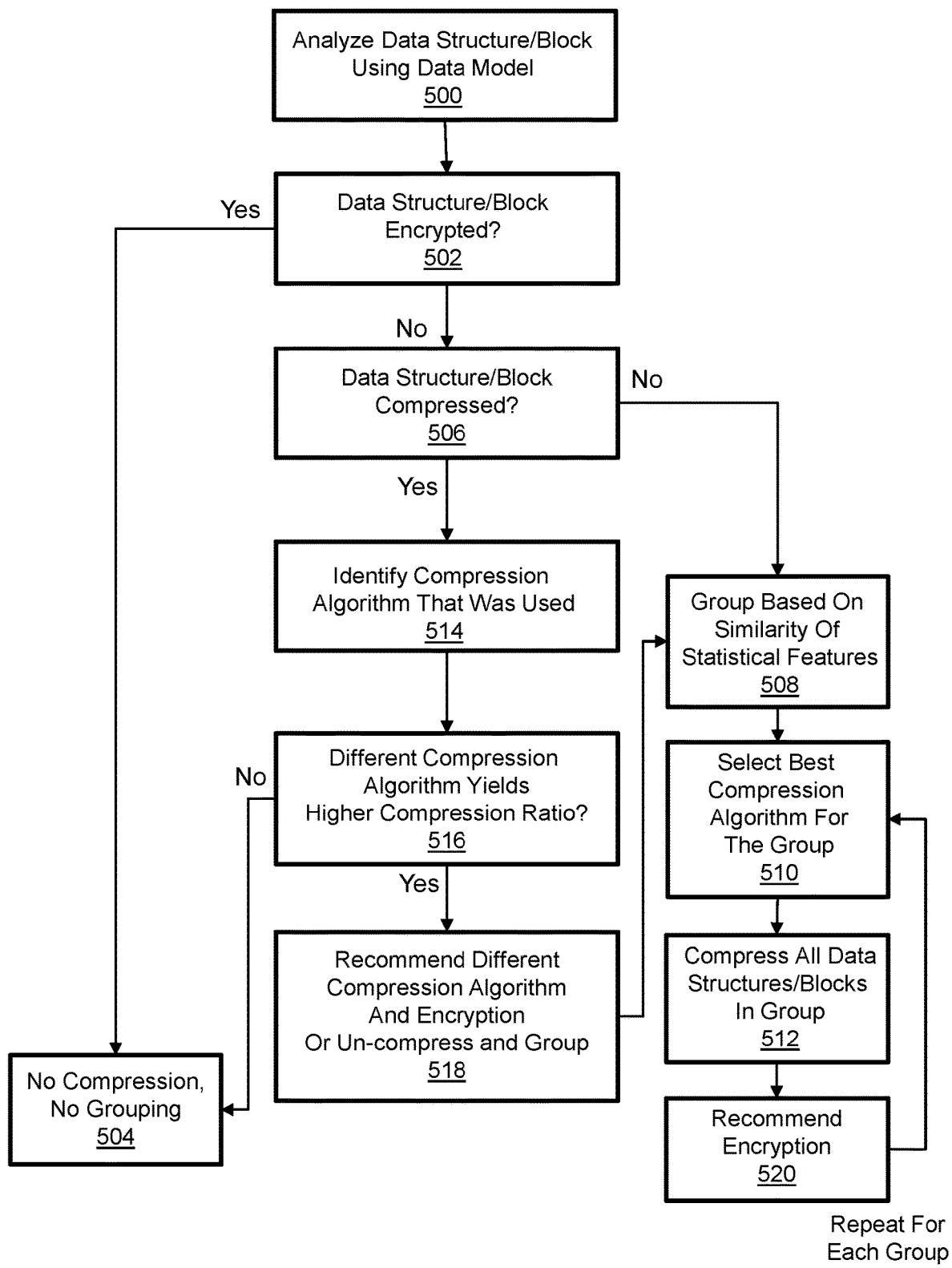
FIG. 5 illustrates operation of the recommendation engines of FIGS. 2 and 3.

FIG. 5 illustrates operation of the recommendation engines. Step 500 is using the validated data model to analyze the data structures or blocks in stored data for which compression state and encryption state are unknown. Features are extracted from the data structures or blocks in step 500. Extracted features are used by the recommendation engine with the data model to generate data structure or block characterizations. Each characterization indicates whether the data structure or block is raw, compressed, and/or encrypted. The characterization may also indicate which compression algorithm was used to compress the data if the data was determined to be in a compressed state. Examples of data structures may include but are not limited to files, lists, arrays, stacks, queues, and trees. The blocks that are analyzed by the SAN recommendation engine are fixed-size allocation units. The block size used for the data analysis is not necessarily the same as the block size used by the managed drives or the block size associated with the logical devices. The characterizations are used in subsequent steps to generate recommendations. Step 502 is deciding how to proceed with an analyzed data structure or block based on whether it was determined to be in an encrypted state. Encrypted data is generally unsuitable for compression because encryption algorithms tend to generate outputs that lack the patterns that are exploited by compression algorithms. If the data structure or block is encrypted, then it is not compressed or added to a group as indicated in step 504. If the data structure or block is not encrypted, then flow proceeds to step 506 which includes deciding how to proceed with the data structure or block based on whether it was determined to be in a compressed state. If the data structure or block is not compressed, then it is placed in a group based on similarity of statistical features as indicated in step 508. If no suitable group exists, then a new group may be created. When all of the data structures or blocks have been processed the best compression algorithm for the group is selected as indicated in step 510. The data model predicts compressibility, e.g. compression ratio, of data based on statistical features. The compression algorithm selected in step 510 may be the modeled compression algorithm that is predicted to yield the best compression ratio for the average of the statistical feature values of members of the group. The selected compression algorithm is used to compress all data structures or blocks in the group as indicated in step 512. Encryption may be recommended in step 520, e.g. with a single strong encryption algorithm. Steps 510, 512 and 520 are repeated for each group if multiple groups are implemented. If the data structure or block was already compressed, e.g. sent by a host in a compressed state, then step 506 is followed by step 514, which is identifying the compression algorithm that was used to compress the data. The data model can predict which compression algorithm was used if the data model was trained with data that was compressed by that compression algorithm. Step 516 is determining if a different compression algorithm would yield a better compression ratio. The recommendation engine uses the data model to predict compressibility of the data with each compression algorithm with which the data model was trained and if the data was compressed with a compression algorithm that does not yield the best compressibility then the recommendation engine recommends the different compression algorithm that is predicted to yield the best compression ratio in step 518. It is assumed that either the raw form of the data or the values of the statistical features of the raw data are available to the recommendation engine for step 516. For example, compressibility could be predicted with only access to the statistical feature values. A strong encryption scheme may be recommended, e.g. using a single strong encryption algorithm. Alternatively, if it is possible to un-compress the data then the data may be uncompressed and placed in a group based on similarity of features in step 508. For example, the recommendation engine may prompt the host to write the data to the SAN or NAS in uncompressed form so that a different compression algorithm can be used to compress the data. Otherwise, if a different compression algorithm would not yield a higher compression ratio then step 516 is followed by step 504 and the compressed data is not uncompressed and grouped with other data characterized by similar statistical features.

Specific examples have been presented to provide context and convey inventive concepts. The specific examples are not to be considered as limiting. A wide variety of modifications may be made without departing from the scope of the inventive concepts described herein. Moreover, the features, aspects, and implementations described herein may be combined in any technically possible way. Accordingly, modifications and combinations are within the scope of the following claims.

What is claimed is:

1. A method comprising:
   in a storage system comprising at least one compute node that manages access to non-volatile storage, the compute node configured to respond to commands from host nodes to store host application data including a first portion of host application data and a second portion of host application data received from the host nodes without notification of compression state on the non-volatile storage:
   using a machine learning model that has been trained to recognize, from compressed data alone, data compression state, ones of a plurality of different compression algorithms used to perform compression on data, and compressibility of different data types with the ones of the plurality of different compression algorithms:
      calculating, using only the first portion of host application data and the machine learning model, that the first portion of host application data is in an uncompressed state and, in response, prompting compression of the first portion of host application data;
      calculating, using only the second portion of host application data and the machine learning model, that the second portion of host application data is in a compressed state and, in response:
         calculating, using only the second portion of host application data and the machine learning model, that a first compression algorithm of the plurality of different compression algorithms with which the machine learning model was trained was used by the host nodes to compress the second portion of host application data;
         determining, using only the second portion of host application data and the machine learning model, that a second compression algorithm of the plurality of different compression algorithms with which the machine learning model was trained is likely to yield the greatest compression ratio in comparison with other compression algorithms with which the machine learning model has been trained, including the first compression algorithm; and
         prompting use of the second compression algorithm rather than the first compression algorithm with the second portion of host application data.

2. The method of claim 1 comprising grouping data structures or blocks of the host application data based on similarity of statistical features.

3. The method of claim 2 comprising compressing all data structures or blocks in a group with a single compression algorithm.

4. The method of claim 3 wherein the machine learning model has been trained to recognize encryption state and comprising using the machine learning model to identify the encryption state of the host application data stored on the non-volatile storage and grouping uncompressed and unencrypted data structures or blocks of the host application data based on similarity of statistical features and prompting compression and encryption of all the data structures or blocks in the group with the single compression algorithm and a single encryption algorithm.

5. The method of claim 1 comprising using the machine learning model to identify a different compression algorithm that projects to yield a better compression ratio.

6. The method of claim 1 comprising uncompressing and grouping a data structure or block in response to identifying a different compression algorithm that projects to yield a better compression ratio.

7. The method of claim 1 comprising training the machine learning model to recognize compression state using statistical features.

8. The method of claim 1 comprising training the machine learning model to recognize compression state using one or more of entropy, Chi square test, Pearson's correlation coefficient, mean, median, mode, standard deviation, skewness, and kurtosis.

9. An apparatus comprising:
   at least one compute node that manages access to non-volatile storage, the compute node configured to respond to commands from host nodes to store host application data including a first portion of host application data and a second portion of host application data received from the host nodes without notification of compression state on the non-volatile storage;
   a machine learning data model that has been trained to recognize from compressed data alone:
      data compression state;
      ones of a plurality of different compression algorithms used to perform compression on data; and
      compressibility of different data types with the ones of the plurality of different compression algorithms; and
   a recommendation engine that uses the machine learning data model to analyze host application data stored on the non-volatile storage, including the first portion of host application data and the second portion of host application data, to:
      calculate, using only the first portion of host application data and the machine learning model, that the first portion of host application data is in an uncompressed state and, in response, prompt compression of the first portion of host application data;
      calculate, using only the second portion of host application data and the machine learning model, that the second portion of host application data is in a compressed state and, in response:

calculate, using only the second portion of host application data and the machine learning model, that a first compression algorithm of the plurality of different compression algorithms with which the machine learning model was trained was used by the host nodes to compress the second portion of host application data;

determine, using only the second portion of host application data and the machine learning model, that a second compression algorithm of the plurality of different compression algorithms with which the machine learning model was trained is likely to yield the greatest compression ratio in comparison with other compression algorithms with which the machine learning model has been trained, including the first compression algorithm; and prompt use of the second compression algorithm rather than the first compression algorithm with the second portion of host application data.

10. The apparatus of claim 9 wherein the recommendation engine groups data structures or blocks of the host application data based on similarity of statistical features.

11. The apparatus of claim 10 wherein the recommendation engine prompts compression of all data structures or blocks in a group with a single compression algorithm.

12. The apparatus of claim 11 wherein the machine learning model has been trained to recognize encryption state and the recommendation engine uses the machine learning model to identify the encryption state of the host application data stored on the non-volatile storage and groups uncompressed and unencrypted data structures or blocks of the host application data based on similarity of statistical features and prompts compression and encryption of all the data structures or blocks in the group with the single compression algorithm and a single encryption algorithm.

13. The apparatus of claim 9 wherein the recommendation engine uses the machine learning model to identify a different compression algorithm that projects to yield a better compression ratio.

14. The apparatus of claim 9 wherein the recommendation engine prompts uncompressing and grouping of a data structure or block in response to identifying a different compression algorithm that projects to yield a better compression ratio.

15. The apparatus of claim 9 wherein the machine learning model is trained to recognize compression state using statistical features.

16. The apparatus of claim 15 wherein the statistical features comprise one or more of entropy, Chi square test, Pearson's correlation coefficient, mean, median, mode, standard deviation, skewness, and kurtosis.

17. The apparatus of claim 16 wherein the statistical features further comprise data structure type and data structure size.

18. The apparatus of claim 17 wherein the data structure comprises at least one of files, lists, arrays, stacks, queues, and trees.

* * * * *